United States Patent [19]

Morimoto

[11] Patent Number: 5,668,390

[45] Date of Patent: Sep. 16, 1997

[54] SOLID-STATE IMAGE SENSOR WITH ELEMENT ISOLATION REGION OF HIGH IMPURITY CONCENTRATION AND METHOD OF MANUFACTURING THE SAME

[75] Inventor: Michihiro Morimoto, Tokyo, Japan

[73] Assignee: NEC Corporation, Tokyo, Japan

[21] Appl. No.: 629,531

[22] Filed: Apr. 9, 1996

[30] Foreign Application Priority Data

Apr. 20, 1995 [JP] Japan .................... 7-095088

[51] Int. Cl.$^6$ .................... H01L 27/148; H01L 29/768
[52] U.S. Cl. .................... 257/232; 257/221; 257/224; 257/233; 257/243
[58] Field of Search .................... 257/221, 224, 257/232, 233, 243

[56] References Cited

U.S. PATENT DOCUMENTS

| | | | |
|---|---|---|---|
| 4,851,890 | 7/1989 | Miyataki | 257/232 |
| 5,424,775 | 6/1995 | Kamisaka et al. | 257/232 |
| 5,432,363 | 7/1995 | Kamisaka et al. | 257/232 |
| 5,585,653 | 12/1996 | Nakashiba | 257/233 |

FOREIGN PATENT DOCUMENTS 6-151806  5/1994  Japan .................... 257/232

*Primary Examiner*—Ngân V. Ngô
*Attorney, Agent, or Firm*—Whitham, Curtis, Whitham & McGinn

[57] ABSTRACT

The solid-state image sensor disclosed has a photodiode including a P-type layer provided on a surface of a semiconductor substrate, an N-type layer provided in the N-type layer, and a P$^+$-type region which is disposed on a surface of the N-type layer. A P$^{++}$-type region is disposed in a region surrounding the photodiode excepting in a read region for reading out charges in the photodiode, and this P$^{++}$-type region has a higher impurity concentration and a greater depth than the P$^+$-type region. That is, the P$^{++}$-type region which isolates photodiode regions and vertical CCD regions from one another is formed as a high impurity concentration diffusion layer or an electron trap region containing a large amount of electron trap centers. Thus, it is possible to reduce smear generation in unit pixels and to produce sharp images.

4 Claims, 10 Drawing Sheets

SOLID-STATE IMAGE SENSOR WITH ELEMENT ISOLATION REGION OF HIGH IMPURITY CONCENTRATION AND METHOD OF MANUFACTURING THE SAME

BACKGROUND OF THE INVENTION (1) Field of the Invention

The present invention relates to CCD (Charge Coupled Device) type solid-state image sensors, and more particularly to element isolation region structures thereof and method of manufacturing the same.

(2) Description of the Related Art

In CCD type solid-state image sensors, increasing the number of pixels in an image sensor region formed on a chip and reducing the image sensor size by producing finer semiconductor elements are very important, and the development in these connections is being made vigorously. Presently, solid-state image sensors, in which 2,000,000 pixels are formed in a ⅔ inch optical format size, are available.

In such advancement of CCD type solid-state image sensors, it is important to reduce smear, i.e., generation of false signal due to flow of charges into a vertical CCD region to be described later. A prior art CCD type solid-state image sensor will now be described with reference to FIGS. 1A, 1B, 2A and 2B. FIGS. 1A and 1B are plan views showing the device, and FIGS. 2A and 2B are sectional views showing a pixel section.

FIG. 1A is a plan view showing a usual inter-line CCD type solid-state image sensor. This inter-line CCD type solid-state image sensor comprises a plurality of photodiodes 101, vertical CCD regions 102 for receiving and transferring charge from the photodiodes, a horizontal CCD register 103 for receiving and transferring charge from the vertical CCD regions, a charge detector 104 for detecting charge that has been transferred from the horizontal CCD register, and an output amplifier 105. The portion enclosed within a broken line rectangle is a unit pixel 106.

FIG. 1B is a plan view showing the structure of the unit pixel 106. As shown in FIG. 1B, the unit pixel 106 has an element isolation region 107 or 107a which is constituted by a P-type diffusion layer. A photodiode region 108 is formed so as to be within the element isolation region 107. Charge generated in the photodiode region 108 is transferred through a transfer transistor to the vertical CCD region. The gate electrode of this transfer transistor is a transfer gate electrode 109. The gate electrode of this vertical CCD region is constituted by a transfer gate electrode 110 and the transfer gate electrode 109. A light-shielding film 111 is formed to cover the vertical CCD. The light-shielding film 111, as shown in FIG. 1B, has an opening formed in a region corresponding to the photodiode region 108.

The sectional structure of the unit pixel will now be described with reference to FIGS. 2A and 2B. FIG. 2A is a sectional view taken along line 2A—2A in FIG. 1B. FIG. 2B is a sectional view taken along line 2B—2B in FIG. 1B.

Referring to FIGS. 2A and 2B, a P-type impurity well layer 202 is formed on the surface of an N-type semiconductor substrate 201. An N-type impurity layer 203 constitutes the photodiode region 108 shown in FIGS. 1A and 1B, and a P⁺-type impurity layer 204 is formed on the layer 203 for suppressing dark current. A transfer impurity layer 205 constitutes a channel region of the vertical CCD region 102 shown in FIGS. 1A and 1B, and a P-type impurity layer 206 is formed under the layer 205. The transfer impurity layer 205 usually has N-type conductivity. Between adjacent photodiode regions 108 shown in FIGS. 1A and 1B and also between the photodiode regions 108 and the vertical CCD regions 102, an element isolation region 208 is formed except for a channel region 207 of the transfer transistor. Although not shown, an additional impurity layer may be formed in the neighborhood of the semiconductor substrate surface of the channel region 207 for transistor threshold voltage adjustment. A gate insulating layer 209, such as a silicon dioxide film or a nitride film, is formed on one principal surface of the N-type substrate 201. A transfer gate electrode 210, such as a polysilicon film, and a transfer gate electrode 211 constituting the gate electrode of transfer transistor, are formed on the layer 209. A further insulating film (not shown), is formed between the transfer gate electrode 210 and the transfer gate electrode 211. Over these electrodes a light-shielding film 213, such as a tungsten film or an aluminum film, is formed via an inter-layer insulating film 212, such as a silicon dioxide film. A cover film, such as a silicon dioxide film, is formed to cover the structure as described.

One of the important characteristics of the CCD is the smear characteristic. The smear is generally constituted by three elements, i.e., electrons that are generated by light incident on the substrate and diffused in the vertical CCD regions, electrons generated by light incident on the vertical CCD regions due to multiple reflection between the transfer gate electrodes and the surface of the semiconductor substrate, and electrons generated by light transmitted through the light-shielding film and incident on the vertical CCD regions.

Among these electrons, those which are generated due to the multiple reflection mentioned above, are reduced by the thickness reduction of the gate insulating film resulting from finer structure of the semiconductor elements explained above. The electrons among those attributable to the transmission through the light-shielding film, are reduced by improving the step coverage in the formation of the tungsten film and aluminum film.

On the other hand, the electrons that are generated by light incident on the surface of the semiconductor substrate and diffused in the vertical CCD regions, are more pronounced as the semiconductor element structure becomes finer. In the present technique, however, the consideration given to the diffused electrons is insufficient. For example, the relation between the impurity concentrations in the P⁺-type impurity layer 204 and the element isolation region 208 shown in FIGS. 2A and 2B, has not yet been particularly investigated. Generally, the P⁺-type impurity layer 204 is formed to have a depth of 0.1 to 0.3 μm for improving the blue sensitivity of the photodiode. The main purpose of the P⁺-type impurity layer 204 is to reduce dark current by preventing the formation of a depletion layer on the semiconductor substrate surface of the photodiode region contiguous to the gate insulating film 209. The P⁺-type impurity layer 204 which is thin as explained above, has to have sufficiently high impurity concentration. This means that the impurity concentration of the P⁺-type impurity layer is comparable to or above the impurity concentration of the element isolation region 208. Under this condition, it is necessary to take into consideration new diffused electrons explained hereunder.

With a fine pixel size of about 5 μm square, the width of the element isolation region 208 is about 0.6 μm. For smear suppression, it is necessary to increase the extent in which the light-shielding film 213 extends over the photodiode region 108. On the other hand, the dose of light incident on the N-type impurity layer 203 of the photodiode, is restricted by the size of the opening in the light-shielding film 213. Thus, it is necessary to increase the size of the opening for sensitivity increase. As a result of the trade-off of the two factors, it is possible to set the distance between the end of the light-shielding film and the end of the element isolation region to be as small as about 0.5 µm. The thermal motion speed of electrons at room temperature is about $10^5$ m/sec., and electrons generated in the $P^+$-type impurity layer 204 by light irradiation on the neighborhood of the end of the light-shielding film, can move a distance of about 1 µm in about $10^{-11}$ sec. This time interval is far short compared to the lifetime of electrons in the interface between the semiconductor substrate and the insulating film or the lifetime of electrons in the element isolation region. Therefore, electrons generated in the $P^+$-type impurity layer 204 are partly diffused, without being vanished, in the $P^+$-type impurity layer 204 and element isolation region 208 to flow into the transfer impurity layer 205 constituting the vertical CCD regions. This leads to the problem of increasing the smear.

SUMMARY OF THE INVENTION

An object of the invention is to provide a method of effectively reducing smear generated in unit pixels of CCD type solid-state image sensors which are becoming increasingly finer in structure, thus permitting obtaining sharp images.

According to one aspect of the invention, there is provided a solid-state image sensor having a photodiode including a P-type layer provided on a surface of a semiconductor substrate and an N-type layer provided in the P-type layer, and comprising:

a $P^+$-type region which is disposed on a surface of the N-type layer and which constitutes the photodiode together with the P-type layer and the N-type layer; and a $P^{++}$-type region which is disposed in a region surrounding the photodiode excepting in a read region for reading out charges in the photodiode and which has a higher impurity concentration and a greater depth than the $P^+$-type region.

The impurity concentration in the $P^{++}$-type region ranges from 10 to $10^3$ times the impurity concentration in the $P^+$-type region.

The $P^{++}$-type region has a central region having a higher impurity concentration than the $P^{++}$-type region.

The $P^{++}$-type region has a central region containing oxygen atoms, which serve as a region to trap electrons and cause the electrons to be recombined with holes in the $P^{++}$-type region.

According to the invention, a method of fabricating a solid-state image sensor is provided, which includes that steps of:

forming a first insulating film patterned over a surface of the semiconductor substrate;

forming the $P^{++}$-type region through ion implantation of boron as impurity with the first insulating film used as a mask;

depositing a second insulating film covering the first insulating film and the $P^{++}$-type region;

forming a side wall insulating film along patterned side walls of the first insulating film by anisotropic reactive ion etching of the second insulating film; and ion implanting boron as impurity again with the first insulating film and the side wall insulating film used as a mask.

Alternatively, the last step in the above method may be carried out by ion implanting oxygen with the first insulating film and the side wall insulating film used as a mask.

BRIEF DESCRIPTION OF THE DRAWINGS

The above and other objects, features and advantages of the present invention will be apparent from the following description of preferred embodiments of the invention explained with reference to the accompanying drawings, in which.

PREFERRED EMBODIMENTS OF THE INVENTION

Now, the invention is explained with reference to the drawings. Specifically, FIG. 3 is a plan view showing a unit pixel, and FIGS. 4A and 4B are sectional views showing the same unit pixel.

Figure 1A:
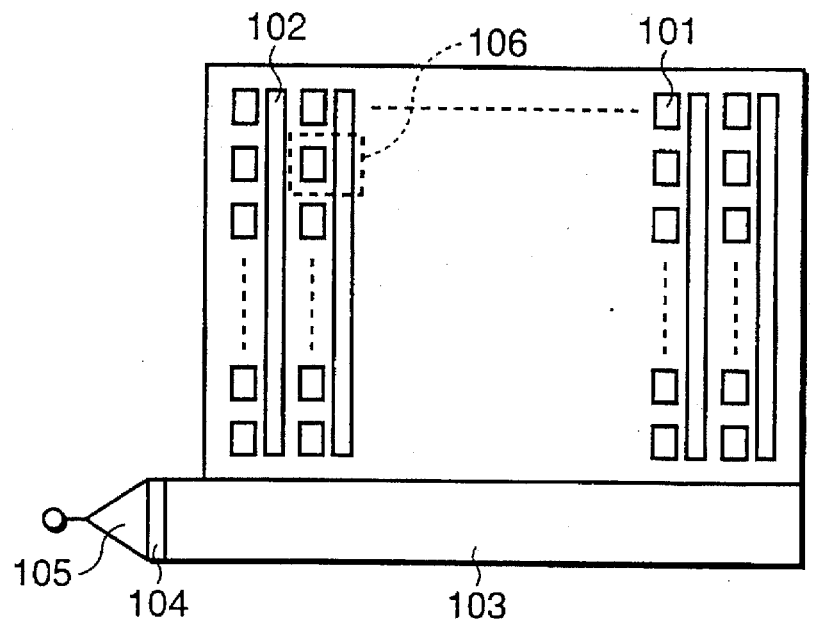
FIGS. 1A and 1B are a plan view and a fragmentary plan view respectively showing a prior art inter-line CCD type solid-state image sensor and a unit pixel thereof.
Figure 1B:
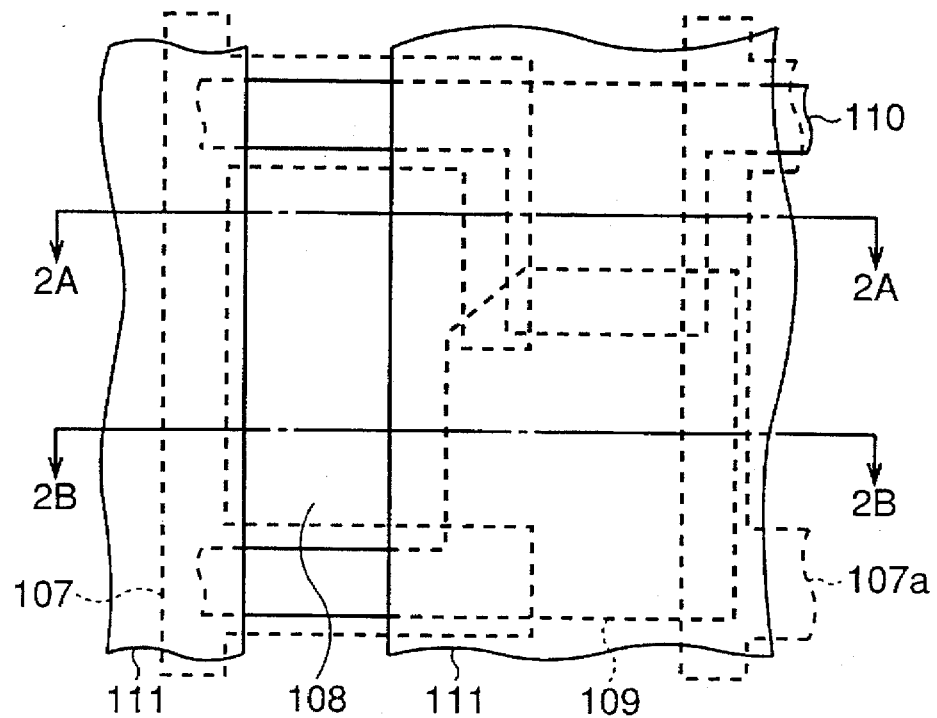
Figure 2A:
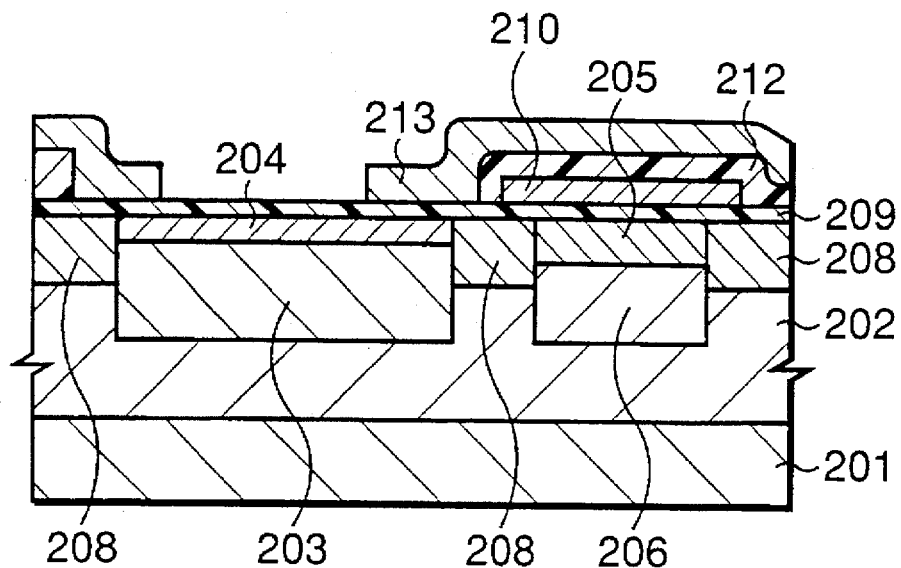
FIGS. 2A and 2B are sectional views showing the prior art unit pixel.
Figure 2B:
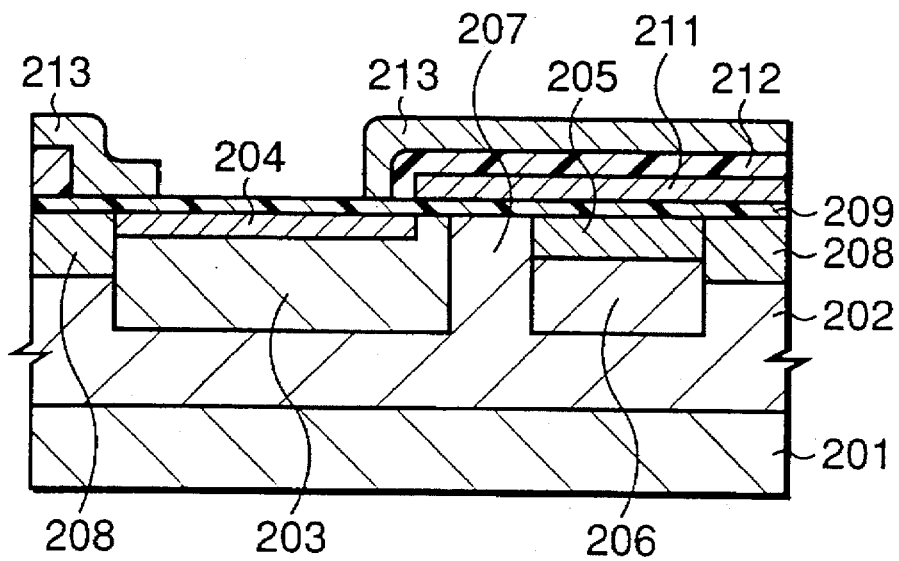
Figure 3:
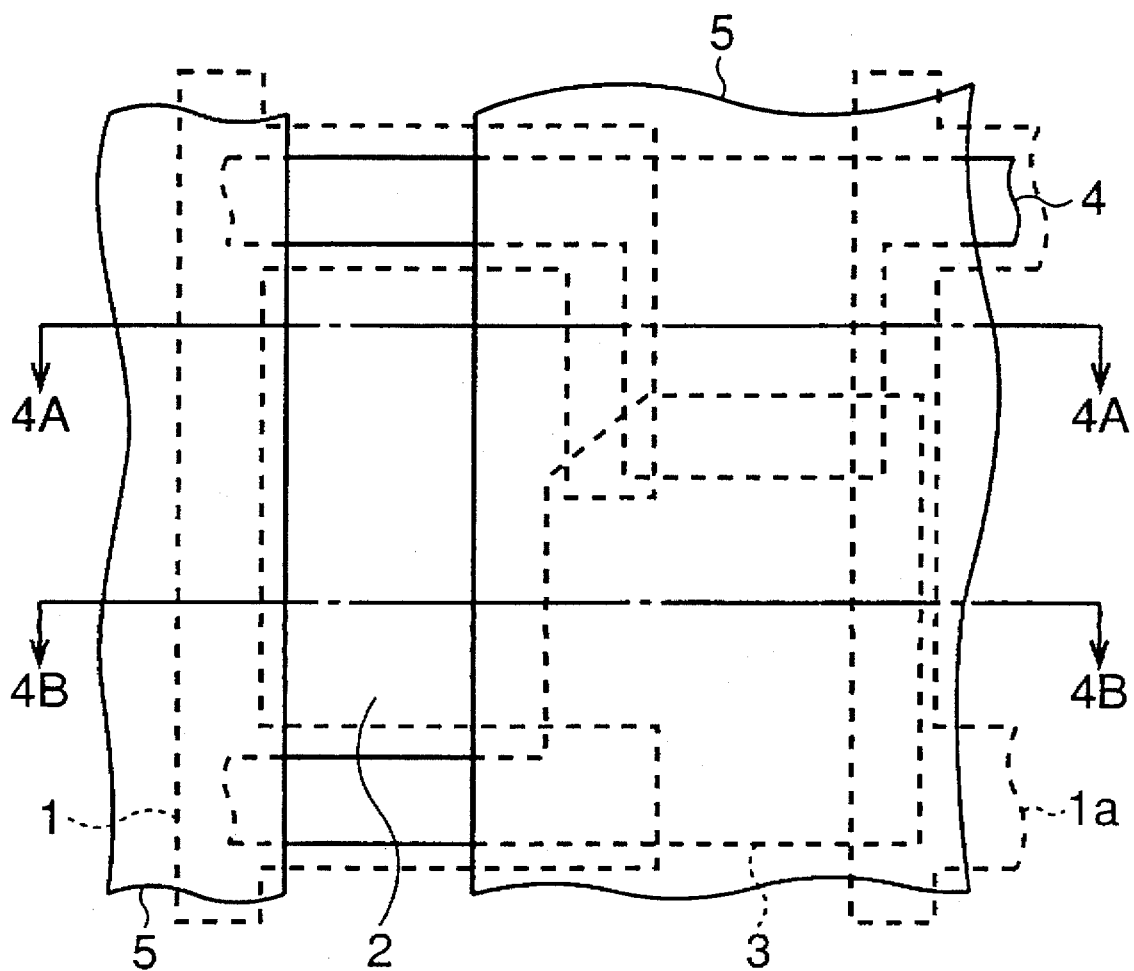
FIG. 3 is a plan view showing a unit element for explaining the invention.

As shown in FIG. 3, the unit pixel has the same structure in plan view as that in the prior art described. The unit pixel has an element isolation region 1 or 1a which is constituted by a P-type diffusion layer. A photodiode region 2 is formed such that it is enclosed within the element isolation region 1. Charge, i.e., electrons, generated in the photodiode region 2 is transferred through a transfer transistor to the vertical CCD region. The gate electrode of this transfer transistor is the transfer gate electrode 3. The gate electrode of this vertical CCD is constituted by transfer gate electrodes 3 and 4. A light-shielding film 5 is formed to cover the vertical CCD. The light-shielding film 5 has an opening formed in a region corresponding to the photodiode region 2.

Figure 4A:
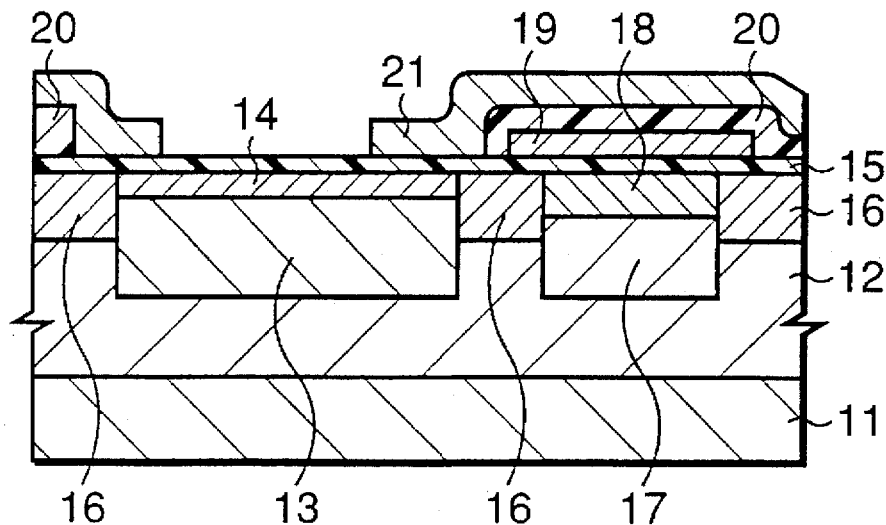
FIGS. 4A and 4B are sectional views showing a unit pixel for describing a first embodiment of the invention.
Figure 4B:
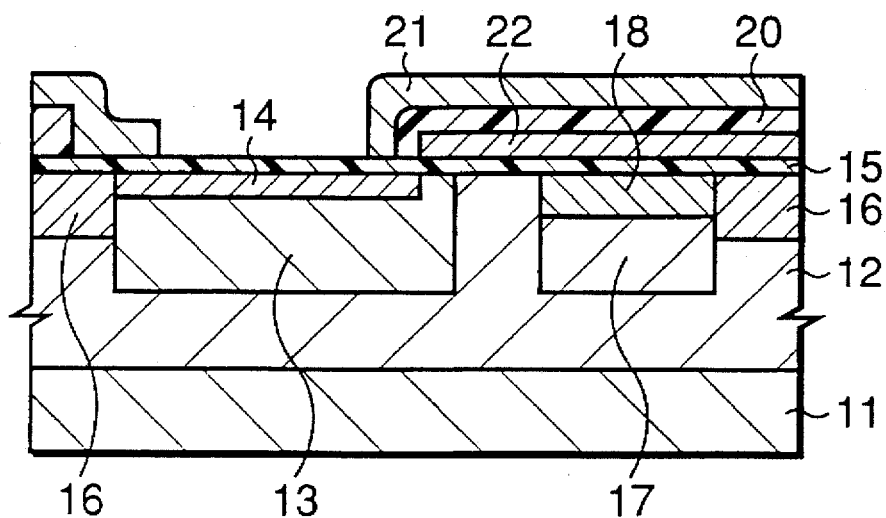

FIGS. 4A and 4B show the sectional structure of the unit pixel according to the invention. FIG. 4A is a sectional view taken along line 4A—4A in FIG. 3, and FIG. 4B is a sectional view taken along line 4B—4B in FIG. 3. As shown in FIG. 4A, a P-type impurity well layer 12 is formed on the surface of an N-type semiconductor substrate 11. This well layer 12 has an impurity concentration of about $10^{15}$ atoms/ $cm^3$ and a depth of about 2 µm. An N-type impurity layer 13 is formed, which constitutes a photodiode. The N-type impurity layer 13 has an impurity concentration of $10^{16}$ atoms/$cm^3$ and has a depth of about 1 µm. A $P^+$-type impurity layer 14 is formed on the surface of the N-type impurity layer 13. The $P^+$-type impurity layer 14 has an impurity concentration of $10^{17}$ to $10^{18}$ atoms/$cm^3$ and a depth of 0.1 to 0.3 µm.

The $P^+$-type impurity layer 14 is essential for preventing dark current from being generated through the energy level of the interface between the gate insulating film 15 and the semiconductor substrate. An element isolation region 16 is then formed. The element isolation region 16 has a $P^{++}$-type impurity, and the concentration thereof is set to $10^{19}$ to $10^{20}$ atoms/cm$^3$. The element isolation region 16 has a depth of about 0.6 µm. The impurity concentration in the element isolation region 16 is thus higher than the impurity concentration in the $P^+$-type impurity layer 14. As described before, the element isolation region 16, which is of the $P^{++}$-type impurity layer, has a greater depth than the $P^+$-type impurity layer 14.

A transfer region for transferring charge in the vertical CCD region noted above, is constituted by an N-type transfer impurity layer 18 formed on a surface of a P-type impurity layer 17 and a transfer gate electrode 19 on the gate insulating film 15. An inter-layer insulating film 20 is formed on the transfer gate electrode 19. The inter-layer insulating film 20 is a silicon oxide film having a thickness of about 200 nm. A light-shielding film 21 is formed to cover the inter-layer insulating film 20 and a portion of the gate insulating film 15. The light-shielding film 21 has an opening corresponding to the region of the photodiode. The light-shielding film 21 is formed by the CVD (chemical vapor deposition) process using metallic tungsten which is excellent in the covering property or metallic aluminum.

FIG. 4B shows the structure of a charge read region, i.e., a region for transferring charge generated in the photodiode region to the vertical CCD region. As shown in FIG. 4B, an N-type impurity layer 13 as photodiode region is formed on the surface of a P-type impurity well layer 12, and a $P^+$-type impurity layer 14 is formed on the layer 13. An element isolation region 16 is then formed. A P-type impurity layer 17 is formed on the surface of the P-type impurity well layer 12, and a transfer impurity layer 18 is formed on the layer 17. The transfer impurity layer 18 has N-type conductivity. A transfer transistor is thus formed, which has its source/drain regions constituted by the N-type impurity layer 13 and transfer impurity layer 18, has its channel region constituted by the P-type impurity well layer 12, and has its gate electrode constituted by the transfer gate electrode 22, with the gate insulating film 15 being interposed between the source/drain regions and the gate electrode. As in FIG. 4A, an inter-layer insulating film 20 and a light-shielding film 21 are formed on the transfer gate electrode 22. This transfer transistor causes charge stored in the N-type impurity layer 13 in the photodiode region to be transferred to the vertical CCD region.

With the structure of the unit pixel as described above, the amount of charge generated in the $P^+$-type impurity layer 14 by light irradiation, i.e., the amount of electrons diffused in the transfer impurity layer 18 among the generated electrons, is greatly reduced. The smear characteristic of the solid-state image sensor is improved. The reason why this is so will now be described with reference to FIGS. 5A and 5B.

Figure 5A:
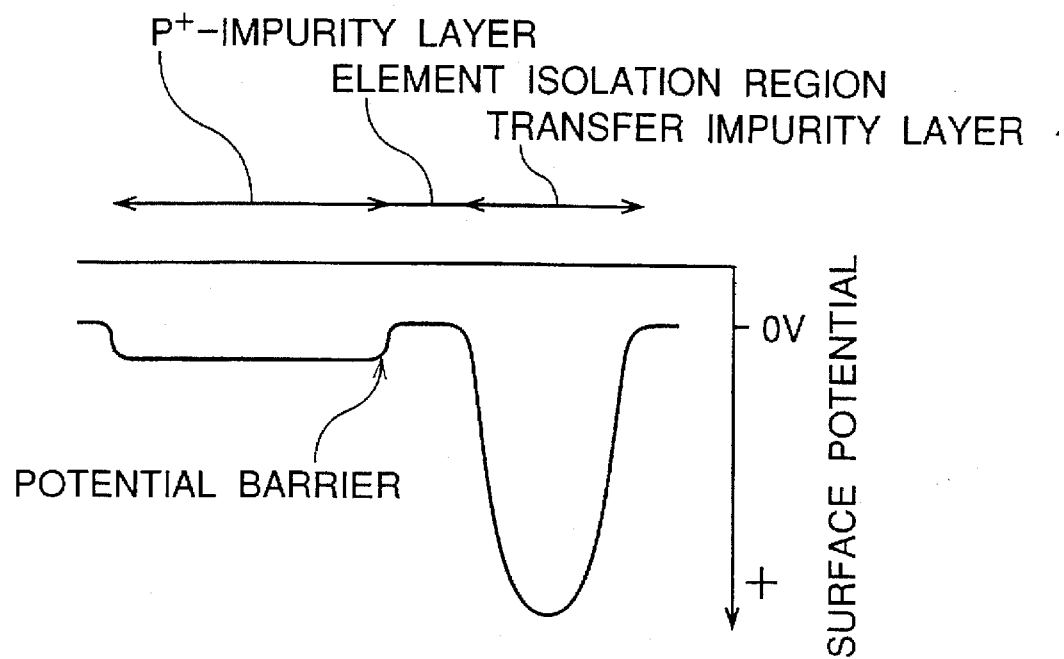
FIGS. 5A and 5B are graphs showing surface potential distribution for describing the effect of the first embodiment of the invention.

FIG. 5A is a graph showing surface potential distribution over the semiconductor substrate surface shown in FIG. 4A. The element isolation region is at a lower potential than the $P^+$-type impurity layer, thus forming a potential barrier against the diffusion of electrons photo-excited in the $P^+$-type impurity layer in the vertical CCD region, i.e., the transfer impurity layer. When the impurity concentration of the element isolation region is 10, 100 and 1,000 times the impurity concentration of the $P^+$-type impurity layer, for instance, the potential barrier is about 26 mV, about 52 mV and about 78 mV, respectively. Considering that the average energy of thermal diffusion of electrons at room temperature is less than 40 mV, the impurity concentration difference is desirably 30 times or above for obtaining an effective potential barrier. The potential barrier thus formed suppresses thermal diffusion of electrons photo-excited in the $P^+$-type impurity layer in the transfer impurity layer, thus permitting effective smear suppression.

Figure 5B:
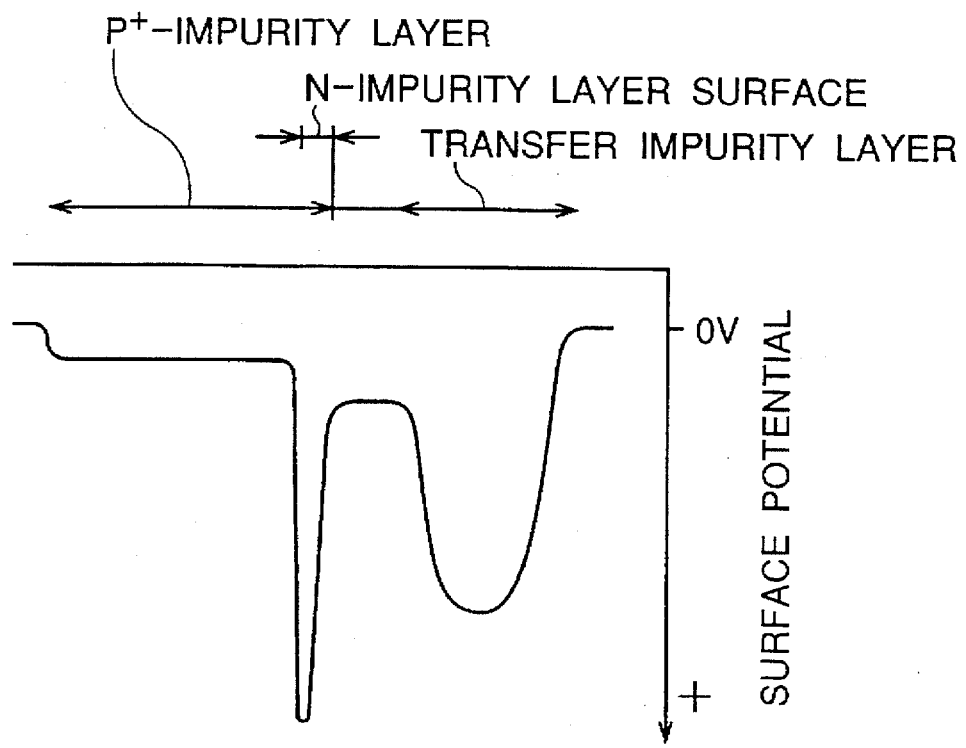

FIG. 5B is a graph showing the surface potential distribution over the semiconductor substrate surface shown in FIG. 4B. Some of electrons generated in the $P^+$-type impurity layer by light incident on the end of the light-shielding film, are thermally diffused toward the transfer transistor. However, since the potential on the N-type impurity layer is very high as shown in FIG. 5B, the electrons are trapped in this region to be pulled back to the N-type impurity layer. Thus, no smear results.

Figure 6A:
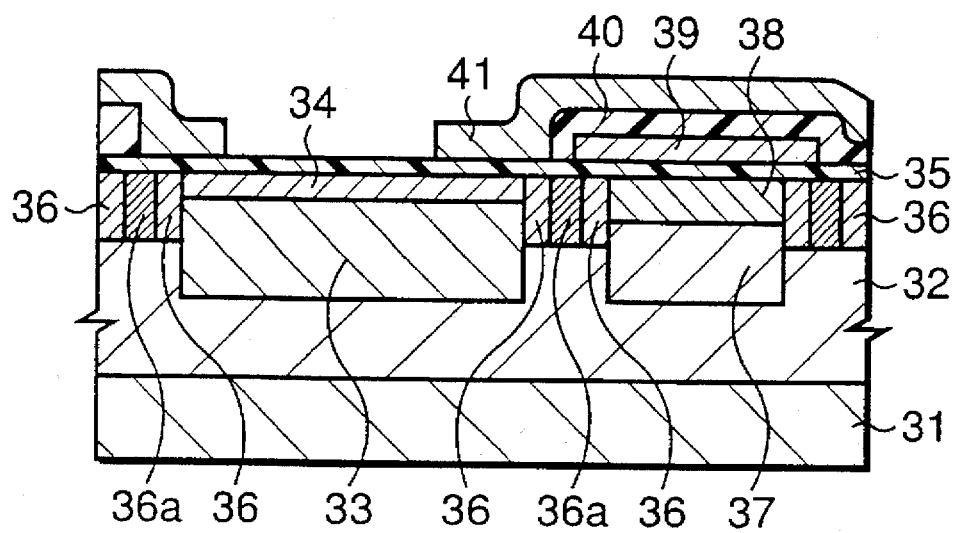
FIGS. 6A and 6B are sectional views showing a unit pixel for describing a second embodiment of the invention.
Figure 6B:
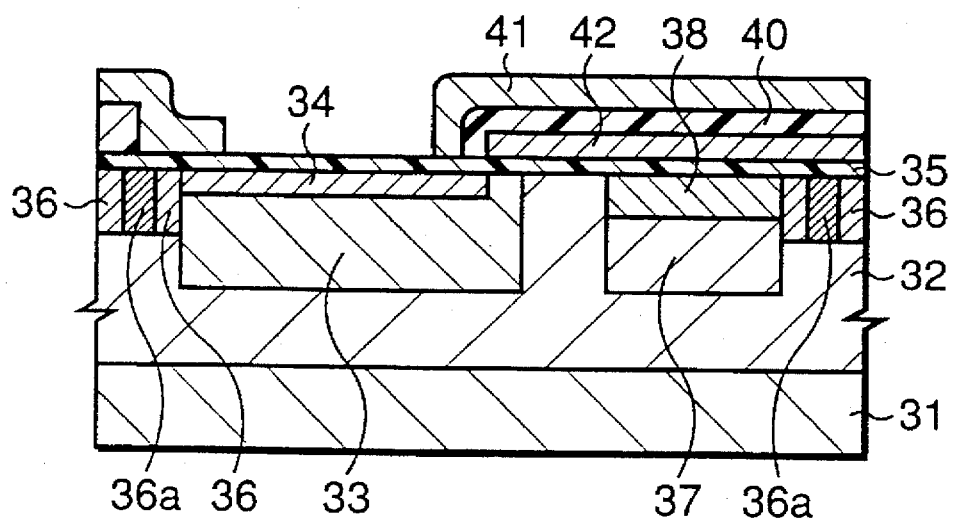

A second embodiment of the invention will now be described. FIGS. 6A and 6B show the sectional structure of the unit pixel according to the invention. FIG. 6A is a sectional view taken along line 4A—4A in FIG. 3, and FIG. 6B is a sectional view taken along line 4B—4B in FIG. 3.

As shown in FIG. 6A, a P-type impurity well layer 32 is formed on the surface of the N-type semiconductor substrate 31. The layer 32 has an impurity concentration of about $10^{15}$ atoms/cm$^3$ and a depth of about 2 µm. An N-type impurity layer 33 is formed, which constitutes a photodiode. The N-type impurity layer 33 has an impurity concentration of $10^{16}$ atoms/cm$^3$ and a depth of 1 µm. A $P^+$-type impurity layer 34 is formed on the surface of the N-type impurity layer 33. The $P^+$-type impurity layer 34 has an impurity concentration of $10^{17}$ to $10^{18}$ atoms/cm$^3$ and has a depth set to a desired value in a range of 0.1 to 0.3 µm.

Then, an element isolation region is formed. As shown in FIG. 6A, this element isolation region includes first element isolation regions 36 and a second element isolation region 36a. Each of the element isolation regions 36 contains a P-type impurity, and the concentration thereof is set to $10^{17}$ to $10^{19}$ atoms/cm$^3$. The impurity concentration in the first element isolation regions 36 is comparable to or above the impurity concentration in the $P^+$-type impurity layer 34. The second element isolation region 36a again contains a P-type impurity, and the concentration thereof is higher than the first element isolation regions 36 and is set to be in a range of $10^{19}$ to $5 \times 10^{20}$ atoms/cm$^3$. The first and second element isolation regions 36 and 36a have widths of 0.2 and 0.3 µm, respectively. The depth of these element isolation regions is set to about 0.6 µm.

As described before, the charge transfer region for transferring charge in the vertical CCD region, is constituted by the transfer impurity layer 38 formed on the surface of the P-type impurity layer 37 and the transfer gate electrode 39 on the gate insulating film 35. An inter-layer insulating film 40 is formed on the transfer gate electrode. Also, a light-shielding film 41 is formed covering the inter-layer insulating film 40 and a part of the gate insulating film 35. The light-shielding film 41 has an opening formed in the photodiode region. The light-shielding film 41 comprises metallic tungsten or metallic aluminum.

FIG. 6B shows the charge read region, i.e., a region for transferring charge generated in the photodiode region to the vertical CCD region. As was the case described with reference to FIG. 6A, an N-type impurity layer 33 constituting a photodiode region is formed on the surface of a P-type impurity well layer 32, and a $P^+$-type impurity layer 34 is formed on the layer 33. The first and second element isolation regions 36 and 36a constitute the element isolation region as described above, which is sandwich-like in form. A transfer impurity layer 38 is formed on the P-type impurity layer 37. The transfer impurity layer 38 has N-type conductivity. A transfer transistor is thus formed, which has its source/drain regions constituted by the N-type impurity layer 33 and the transfer impurity layer 38, has its channel region constituted by a surface region of the P-type impurity well layer 32, and has its gate electrode constituted by the transfer gate electrode 42, with the gate insulating film 35 being interposed between the source/drain regions and the gate electrode. As in the case of FIG. 6A, an inter-layer insulating film 40 and a light-shielding film 41 are formed on the transfer gate electrode 42. This transfer transistor causes charge in the N-type impurity layer 33 in the photodiode region to be transferred to the vertical CCD region.

With this sandwich-like structure comprising element isolation regions having different impurity concentrations, the amount of electrons diffused in the transfer impurity layer 38 among the electrons generated in the P$^+$-type impurity layer 34 by light irradiation, is further reduced compared to the first embodiment.

Figure 7A:
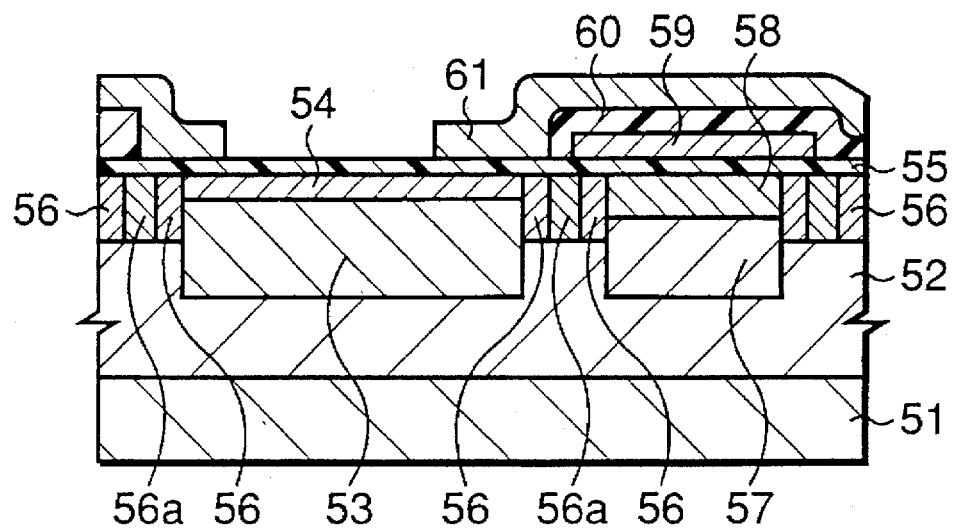
FIGS. 7A and 7B are sectional views showing a unit pixel for describing a third embodiment of the invention.
Figure 7B:
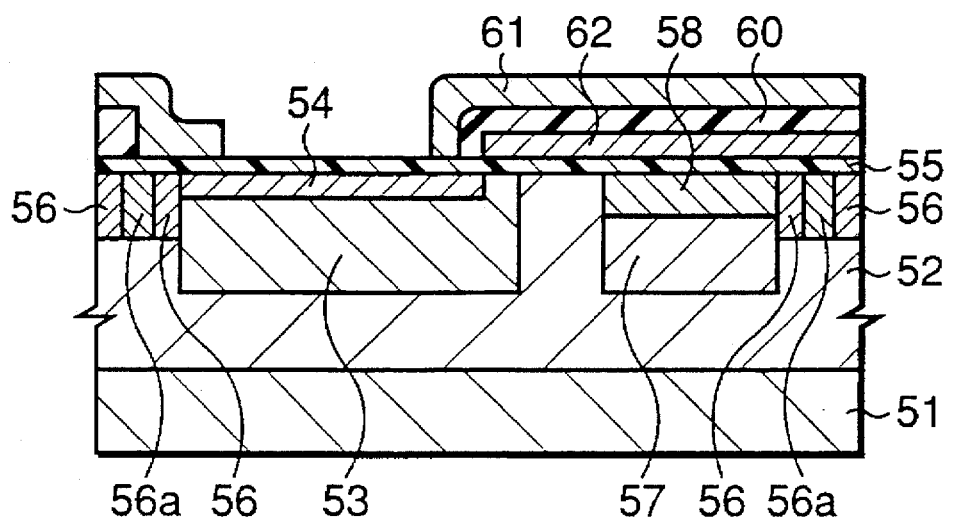

A third embodiment of the invention will now be described. FIGS. 7A and 7B show the sectional structure of the unit pixel according to the invention. FIG. 7A is a sectional view taken along line 4A—4A in FIG. 3, and FIG. 7B is a sectional view taken along line 4B—4B in FIG. 3. This third embodiment is substantially the same in structure as the preceding second embodiment except for the element isolation region structure.

As shown in FIG. 7A, a P-type impurity well layer 52 is formed on the surface of the N-type semiconductor substrate 51. This impurity well layer 52 has an impurity concentration of $10^{15}$ atoms/cm$^3$ and a depth of about 2 µm. An N-type impurity layer 53 is formed which constitutes a photodiode element. The N-type impurity layer 53 has an impurity concentration of $10^{16}$ atoms/cm$^3$ and a depth of about 1.0 µm. A P$^+$-type impurity layer 54 is formed on the surface of the N-type impurity layer 53. The impurity layer 54 has an impurity concentration of $10^{17}$ to $10^{18}$ atoms/cm$^3$ and a depth set to a desired value in a range of 0.1 to 0.3 µm.

Then, an element isolation region is formed. This element isolation region, as shown in FIG. 7A, is constituted by element isolation regions 56 and an electron trap region 56a. Each of the element isolation regions 56 contains a P-type impurity, and the concentration thereof is set to $10^{19}$ to $10^{20}$ atoms/cm$^3$. The electron trap region 56a contains a P-type impurity, with the concentration thereof being the same as in the element isolation regions 56. The electron trap region 56a contains a large amount of electron trap centers. The depth of the element isolation region is set to about 0.6 µm.

The region for transferring charge in the vertical CCD region noted above, is constituted by the transfer impurity layer 58 formed on the surface of the P-type impurity layer 57 and the transfer gate electrode 59 on the gate insulating film 55. An inter-layer insulating film 60 is formed on the transfer gate electrode. A light-shielding film 61 is formed to cover the inter-layer insulating film 60 and a part of the gate insulating film 55. The light-shielding film 61 has an opening formed in the photodiode region.

FIG. 7B shows the structure of the region for transferring charge generated in the photodiode region to the vertical CCD region. An N-type impurity layer 53 as the photodiode region is formed on the surface of the P-type impurity well layer 52, and a P$^+$-type impurity layer 54 is formed on the layer 53. A sandwich-like element isolation layer is formed by the element isolation regions 56 and electron trap region 56a.

A transfer impurity layer 58 is formed on the surface of the P-type impurity layer 57. The impurity layer 58 has N-type conductivity. Thus, a transfer transistor is formed, which has its source/drain regions constituted by the N-type impurity layer 53 and transfer impurity layer 58, has its channel region constituted by the surface of the P-type impurity well layer 52, and has its gate electrode constituted by the transfer gate electrode 62, with the gate insulating film 55 being interposed between the source/drain regions and the gate electrode. As in the case of FIG. 7A, an inter-layer insulating film 60 and a light-shielding film 61 are formed on the transfer gate electrode 62. This transfer transistor causes charge generated in the N-type impurity layer 53 in the photodiode region to be transferred to the vertical CCD region.

With the above element isolation region structure, the amount of electrons flowing into the transfer impurity layer 58 among the charge or electrons generated in the P$^+$-type impurity layer 54 by light irradiation is substantially reduced to zero. The reason why this is so will be described with reference to FIG. 8.

Figure 8:
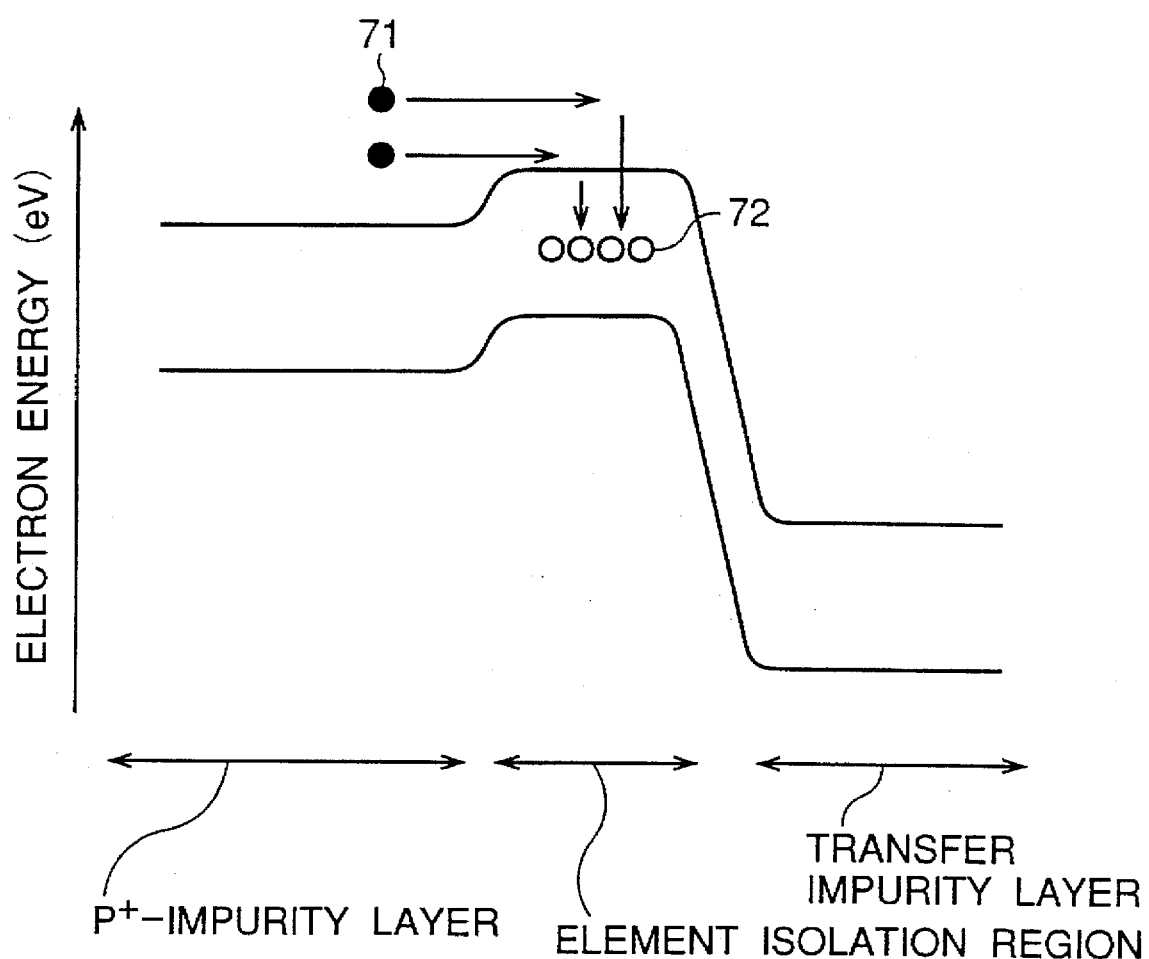
FIG. 8 is a graph showing an energy band structure for describing the effect of the third embodiment of the invention.

FIG. 8 is a graph showing the energy and structure corresponding to a semiconductor substrate surface portion shown in FIG. 7A. As noted before, among the electrons generated in the P$^+$-type impurity layer by light irradiation excitation, are a great amount of high energy electrons. Such high energy electrons 71 can pass over the potential barrier, formed between the P$^+$-type impurity layer and element isolation region. In this embodiment, the electron trap region contains a great amount of electron trap centers 72, and the high energy electrons 71 that have passed over the potential barrier are trapped by electron trap centers 72.

In the case of the third embodiment, it is also possible to obtain the effect described before in connection with the first embodiment, i.e., the effect of suppressing thermal diffusion of electrons. Thus, in this third embodiment smear due to electrons excited by light irradiation in the P$^+$-type impurity layer can be perfectly prevented.

Figure 9A:
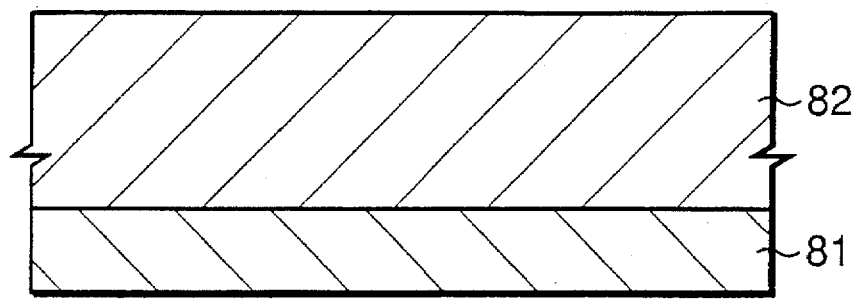
FIGS. 9A to 9F are sectional views showing steps of fabricating the unit pixel described in connection with the third embodiment of the invention.
Figure 9B:
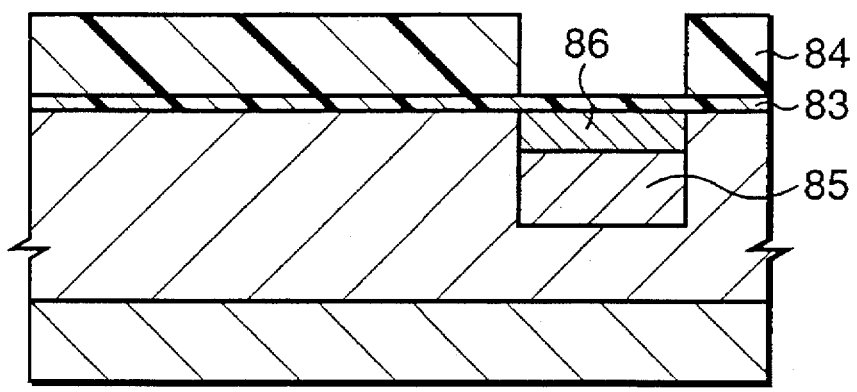

Now, a method of manufacturing the unit pixel described before in connection with the third embodiment, will be described with reference to FIGS. 9A to 9F. FIGS. 9A to 9F are sectional views showing steps of manufacture of the unit pixel. As shown in FIG. 9A, a P-type impurity well layer 82 is formed on the surface of a silicon substrate 81 which is of N-type conductivity and has an impurity concentration of about $10^{14}$ atoms/cm$^3$. The well layer has an impurity concentration of about $10^{15}$ atoms/cm$^3$ and a depth of about 2 µm.

Then, a protective insulating film 83 is formed as a silicon oxide film having a thickness of about 30 nm on the surface of the well layer. Then, a resist mask 84 is formed in a well-known method. Using this mask, a P-type impurity layer 85 is formed through ion implantation of boron, and then a transfer impurity layer 86 is formed through ion implantation of phosphorus. Subsequently, the structure is heat treated such as to make the depths of the P-type impurity layer 85 and transfer impurity layer 86 to 0.8 µm and 0.4 µm, respectively.

Figure 9C:
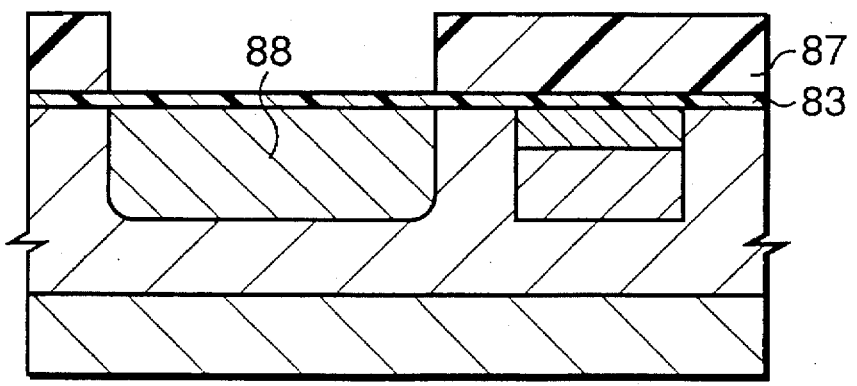

As shown in FIG. 9C, a second resist mask 87 is formed in a well-known process. Then, ion implantation of phosphorus is made using the second resist mask 87. The ion implantation is made with the ion implantation energy set to 500 keV and the dose set to $5 \times 10^{12}$ ions/cm$^2$. Then, an N-type impurity layer 88 is formed through a heat treatment. The N-type impurity layer 88 is formed such that its impurity concentration is about $10^{16}$ atoms/cm$^3$ and its depth is about 1.0 µm. The second resist mask 87 and protective insulating film 83 are subsequently removed.

Figure 9D:
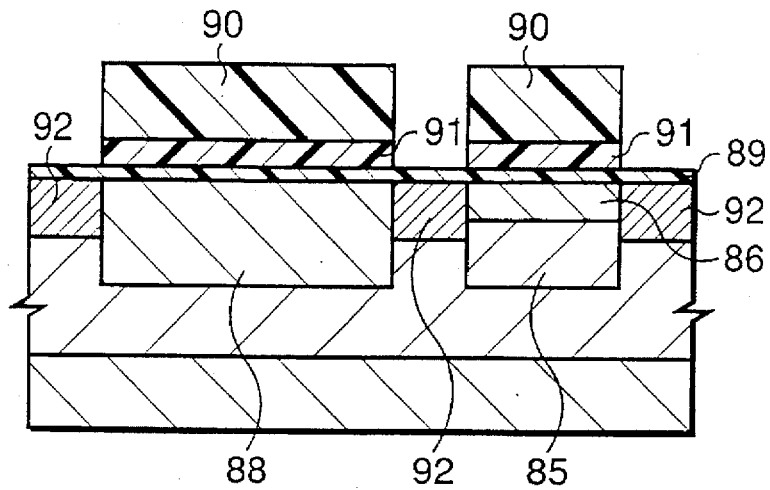

Then, a pad insulating film 89 is formed, as shown in FIG. 9D. The pad insulating film 89 is a silicon oxide film having a thickness of 20 nm. Then, a silicon oxide film containing excessive silicon atoms (hereinafter referred to as SRO film) is deposited. The thickness of the SRO film is set to about 500 nm.

The method of forming the SRO film will be briefly described. This film is formed basically by the same method as the formation of the silicon dioxide film by the CVD process. More specifically, an LPCVD furnace is used, in which a quartz reaction tube capable of pressure reduction is heated by a heater. With the furnace temperature set to 700° to 800° C., monosilane and nitrous oxide gas are introduced as reaction gases into the furnace from separate gas-inlets. Nitrogen gas is used as atmospheric gas. The overall pressure of these gases is set to 1 Torr. In this process, excessive silicon is introduced into the silicon dioxide film. To this end, the rate of flow of monosilane gas is increased by varying the rate of flow of the monosilane and nitrous oxide gases. The amount of excessive silicon is increased with increasing monosilane gas flow rate. In this way, a thin silicon oxide film containing excessive silicon, i.e., SRO film, is formed. The SRO film is an insulator having a structure of a silicon dioxide ($SiO_2$) film containing fine aggregates of silicon. The content of the excessive silicon atoms is set to 10 to 20 atomic %.

Then, as shown in FIG. 9D, the SRO film noted above is etched using the third resist mask 90 as dry etching mask. The dry etching is done under the following conditions. As the dry etching apparatus is used one of magnetron type. The apparatus uses a high frequency power source at 13.56 MHz which is the usual frequency. A blend gas of $NF_3$ and HBr is used as the reaction gas. Under these conditions, it is possible to selectively dry etch the SRO film. In this way, a mask insulating film 91 is formed.

Subsequently, boron is ion implanted using the third resist mask 90 and mask insulating film 91 as ion implantation mask. In this case, the implantation energy is set to 150 keV and the dose is set to $1 \times 10^{15}$ ions/$cm^2$. In this way, an element isolation region 92 is formed. Subsequently, the third resist mask 90 is removed.

Figure 9E:
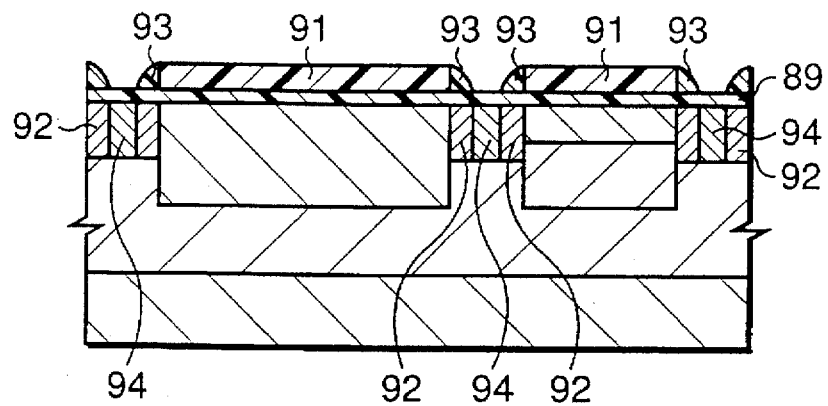

Then, a PSG film (i.e., a silicon oxide film containing phosphorus glass) is deposited. The PSG is formed such that it has a thickness of 200 nm and contains 10 mol % of phosphorus. The entire surface of the PSG film is then etched by anisotropic dry etching. The dry etching apparatus used is as shown above, and the reaction gas is a blend gas of $C_4F_8$ and CO. In this way, a side wall film 93 is formed on the side walls of the mask insulating film 91 as shown in FIG. 9E.

Figure 9F:
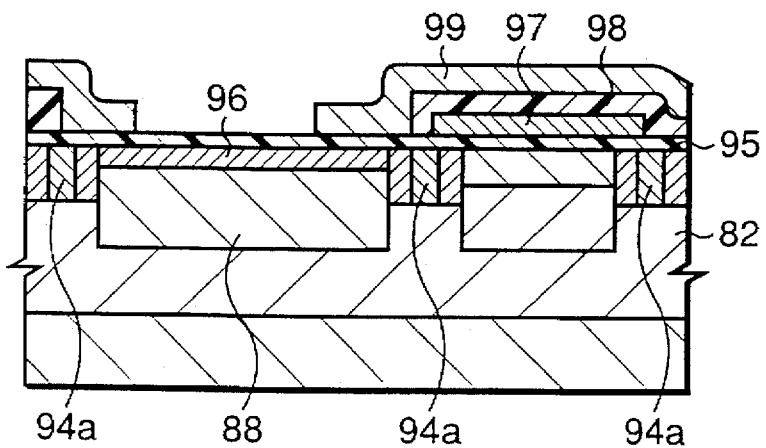

Then, oxygen is ion implanted over the entire surface. The energy of ion implantation is set to 150 to 180 keV. The dose is $5 \times 10^{14}$ to $1 \times 10^{15}$ ions/$cm^2$. In this way, an oxygen-containing region 94 is formed. The structure is then heat-treated at about 900° C. With this treatment, the element isolation region 92 is activated, and a large number of the electron trap centers are formed in the oxygen-containing region 94. This region is an electron trap region 94a as shown in FIG. 9F.

The pad insulating film 89, mask insulating film 91 and side wall insulating film 93 are etched away using a chemical solution. Subsequently, a gate insulating film 95 is formed as shown in FIG. 9E. This insulating film has a thickness of 50 to 100 nm. A $P^+$-type impurity layer 96 is formed on the N-type impurity layer 88. The boron concentration of the $P^+$-type impurity layer 96 is set to $10^{17}$ to $10^{18}$ atoms/$cm^3$. Then, a transfer gate electrode 97, of a polysilicon film for instance, is formed, followed by forming an inter-layer insulating film 98, such as a CVD silicon oxide film, and forming a light-shielding film 99 of tungsten. In this way, the basic structure of the unit pixel formed in the P-type impurity well layer 82 is completed.

As has been described in the foregoing, according to the invention an element isolation region for isolating photodiode regions and vertical CCD regions from one another is formed as a high impurity concentration diffusion layer or an electron trap region containing a great amount of electron trap centers.

It is thus possible to perfectly prevent electrons photo-excited in the photodiode regions, particularly electrons photo-excited in the $P^+$-type impurity layers, from intruding as smear into the vertical CCD regions.

As further advantages of the invention, it is possible to obtain finer semiconductor elements and unit pixels. It is thus possible to provide a solid-state image sensor, which comprises finer semiconductor elements and can provide clearer images.

While the invention has been described in its preferred embodiments, it is to be understood that the words which have been used are words of description rather than limitation and that changes within the purview of the appended claims may be made without departing from the true scope of the invention as defined by the claims.

What is claimed is:

1. A solid-state image sensor having a plurality of photodiodes, comprising:

a P-type layer provided on a surface of a semiconductor substrate;

an N-type layer provided in said P-type layer;

a $P^+$-type region which is disposed on a surface of said N-type layer, said $P^+$-type region and said N-type layer together with said P-type layer constituting each of said photodiodes; and a $P^{++}$-type region which is disposed in a region surrounding said photodiode excepting in a read region for reading out changes in said photodiode and which has a higher impurity concentration and a greater depth than said $P^+$-type region.

2. The solid-state image sensor according to claim 1, wherein the impurity concentration in said $P^{30 +}$-type region ranges from 10 to $10^3$ times the impurity concentration in said $P^+$-type region.

3. The solid-state image sensor according to claim 1, wherein said $P^{++}$-type region has a central region having a higher impurity concentration than said $P^{++}$-type region.

4. The solid-state image sensor according to claim 1, wherein said $P^{++}$-type region has a central region containing oxygen atoms, said central region serving as a region to trap electrons and causing the electrons to be recombined with holes in the $P^{++}$-type region.

* * * * *